(12) United States Patent
Van Keymeulen et al.

(10) Patent No.: US 10,458,050 B2
(45) Date of Patent: Oct. 29, 2019

(54) METHODS FOR ELECTRICALLY CONNECTING TEXTILE INTEGRATED CONDUCTIVE YARNS

(71) Applicants: IMEC vzw, Leuven (BE); Universiteit Gent, Ghent (BE)

(72) Inventors: Bjorn Van Keymeulen, Zottegem (BE); Frederick Bossuyt, Ghent (BE); Thomas Vervust, Ghent (BE); Johan De Baets, Gentbrugge (BE)

(73) Assignees: IMEC vzw, Leuven (BE); Universiteit Gent, Ghent (BE)

( * ) Notice: Subject to any disclaimer, the term of this patent is extended or adjusted under 35 U.S.C. 154(b) by 574 days.

(21) Appl. No.: 14/956,966

(22) Filed: Dec. 2, 2015

(65) Prior Publication Data

US 2016/0160403 A1    Jun. 9, 2016

Related U.S. Application Data

(63) Continuation of application No. PCT/EP2014/063512, filed on Jun. 26, 2014.

(30) Foreign Application Priority Data

Jun. 26, 2013   (EP) ..................... 13173744

(51) Int. Cl.
*D03D 1/00* (2006.01)
*H05K 1/03* (2006.01)
*H05K 3/10* (2006.01)

(52) U.S. Cl.
CPC .......... *D03D 1/0088* (2013.01); *H05K 1/038* (2013.01); *H05K 3/103* (2013.01);
(Continued)

(58) Field of Classification Search
CPC ...... D03D 1/0088; A41D 1/002; A41D 1/005; H01R 4/01; H01R 4/04; H01R 4/58;
(Continued)

(56) References Cited

U.S. PATENT DOCUMENTS 7,138,612 B2   11/2006   Green et al.
7,299,964 B2   11/2007   Jayaraman et al.
(Continued)

FOREIGN PATENT DOCUMENTS

EP   2206813 A1   7/2010
EP   2524983 A2   11/2012
(Continued)

OTHER PUBLICATIONS

Complete Textile Glossary ("Celanese"), Celanese Acetate, 2001, "fabric" entry, p. 60 "fiber" entry, p. 61, and "textile" entry, p. 160 (Year: 2001).*

(Continued)

*Primary Examiner* — Camie S Thompson
(74) *Attorney, Agent, or Firm* — Knobbe, Martens Olson & Bear LLP

(57) ABSTRACT

A textile fabric containing a first electrically conductive thread and a second electrically conductive thread is disclosed. In one aspect, the first electrically conductive thread and the second electrically conductive thread cross at a first crossover point, wherein the textile fabric further contains an electrical connector establishing an electrical connection between the first electrically conductive thread and the second electrically conductive thread. The electrical connector contains a first contact pad in electrical contact with the first electrically conductive thread, a second contact pad in electrical contact with the second electrically conductive thread, and a first stretchable electrical interconnection connecting the first contact pad with the second contact pad. The (Continued)

first contact pad and the second contact pad are provided at a location different from the location of the first crossover point. Methods for electrically interconnecting crossing electrically conductive threads of textile fabrics are also disclosed.

16 Claims, 3 Drawing Sheets

(52) U.S. Cl.
CPC ...... *D10B 2401/16* (2013.01); *D10B 2401/18* (2013.01); *H05K 2201/0281* (2013.01); *H05K 2203/173* (2013.01)

(58) Field of Classification Search
CPC . H01R 4/60; H01R 4/62; H01R 4/625; H01R 4/64; H01R 4/643; H01R 4/646; H01R 4/66; H01R 4/68; H01L 23/4985; H01L 2924/0002; D10B 2401/16; D10B 2401/18; H05K 3/10–207; H05K 1/038; H05K 1/0287; H05K 1/0289; H05K 1/0283; H05K 2201/0281; H05K 2201/0275; H05K 2201/0278; H05K 2203/17; H05K 2203/173; H05K 3/103
USPC .......................................... 156/47; 428/221
See application file for complete search history.

(56) References Cited

U.S. PATENT DOCUMENTS

| | | | |
|---|---|---|---|
| 7,329,323 | B2 | 2/2008 | Dhawan et al. |
| 2004/0224138 | A1* | 11/2004 | Farrell .................... B32B 3/08 |
| | | | 428/209 |
| 2004/0237494 | A1 | 12/2004 | Karayianni et al. |
| 2006/0258205 | A1 | 11/2006 | Locher et al. |
| 2011/0070412 | A1* | 3/2011 | Ly ............................ B32B 5/10 |
| | | | 428/196 |
| 2012/0052268 | A1* | 3/2012 | Axisa ................ H01L 23/49838 |
| | | | 428/212 |

FOREIGN PATENT DOCUMENTS

| | | |
|---|---|---|
| WO | WO 2005/123375 | 12/2005 |
| WO | WO 2009/150570 | 12/2009 |
| WO | WO 2010/058360 | 5/2010 |
| WO | WO 2010/086034 | 8/2010 |
| WO | WO 2010/101633 | 9/2010 |
| WO | WO 2014/207102 | 12/2014 |

OTHER PUBLICATIONS

Locher et al., Fundamental Building Blocks for Circuits on Textiles, IEEE Transactions on Advanced Packaging, vol. 30, No. 3, Aug. 2007.
International Search Report and Written Opinion dated Aug. 4, 2014 in Int'l App. No. PCT/EP2014/063512.

* cited by examiner

METHODS FOR ELECTRICALLY CONNECTING TEXTILE INTEGRATED CONDUCTIVE YARNS

CROSS-REFERENCE TO RELATED APPLICATIONS

This application is a continuation of PCT Application No. PCT/EP2014/063512, filed Jun. 26, 2014, which claims the benefit of EP Application No. EP13173744.7, filed Jun. 26, 2013. Each of the above applications is hereby incorporated by reference in its entirety.

BACKGROUND

Technological Field

The present disclosure relates to methods for electrically connecting electrically conductive threads or yarns integrated with textile, more in particular for electrically connecting crossing conductive threads or yarns in a textile layer.

The present disclosure further relates to textile fabrics or textile layers containing electrically conductive threads or yarns, and containing at least one electrical connection between crossing conductive threads or yarns.

Description of the Related Technology

Integration of electronic devices or electronic circuits with textile can add new functionalities to the textile, allowing the realization of for example, clothes with integrated sensors, luminous textile or wearable computing.

When integrating electronic circuitry with textile, there is also a need for routing signals between various devices. The devices may be distributed over an area of the textile, and they may interact with each other through electrically conductive threads or yarns in the textile. This requires the establishment of electrical connections between crossing electrically conductive threads or yarns, for example for electrically connecting power lines, ground lines or data lines integrated in the textile.

Electrically connecting crossing electrically conductive threads can for example be obtained by soldering or by welding at the crossover points. However, such electrical connections may have a limited mechanical strength and, especially when provided in an elastic or stretchable fabric, they may be damaged or broken as a result of stretching of the fabric or textile.

In "Fundamental Building Blocks for Circuits on. Textiles," IEEE Transactions on Advanced Packaging, Vol. 30, No. 3, August 2007, I. Locher et al. describe a manufacturing technology for establishing arbitrarily-connected wiring structures within a fabric containing a mesh of copper wires coated with an electrical insulation material. Such wiring structures consist of single interconnects between copper wires and are called "textile via's." Forming a textile via according to this technology comprises removal of the coating from the copper wires at predefined yarn intersections, and interconnection of the skinned wire sections by dispensing a drop of conductive adhesive on the skinned spot, thereby electrically connecting two crossing wires. The mechanical reliability of this structure is rather poor, and therefore an epoxy resin is deposited on the connection, to add mechanical and electrical protection. This results in relatively large epoxy features on the textile, which may locally affect the textile properties (e.g. stretchability) in an undesired way, and which may result in a visually unattractive product, being in conflict with the concept of "disappearing electronics" in smart textiles.

SUMMARY OF CERTAIN INVENTIVE ASPECTS

The present disclosure aims to provide textile fabrics with electrical connections between crossing electrically conductive threads, wherein the electrical connections are well integrated into the textile and have a good mechanical strength and a good mechanical reliability. The present disclosure further aims to provide methods for forming such electrical connections between crossing electrically conductive threads in a textile fabric.

The disclosure is related to a textile fabric containing a first electrically conductive thread and a second electrically conductive thread, the first electrically conductive thread and the second electrically conductive thread crossing at a first crossover point, the fabric further containing an electrical connector establishing an electrical connection between the first electrically conductive thread and the second electrically conductive thread, wherein the electrical connector contains a first contact pad in electrical contact with the first electrically conductive thread, a second contact pad in electrical contact with the second electrically conductive thread, and a first stretchable electrical interconnection connecting the first contact pad with the second contact pad. In accordance with the present disclosure, the fabric may contain a plurality of such first electrically conductive threads, generally parallel to each other, a plurality of such second conductive threads, generally parallel to each other and crossing the first electrically conductive threads at crossover points, and a plurality of such electrical connectors each providing a stretchable electrical interconnection between one of the first threads and one of the second threads.

In embodiments of the present disclosure, at least one of the first contact pad and the second contact pad are provided at a location different from the location of the first crossover point. This means that the first contact pad and/or the second contact pad is offset from the first crossover point.

In embodiments of the present disclosure, at least one of the first and second contact pads may be offset from the first crossover point by a distance which is at most twice, preferably at most once the distance between adjacent crossover points in the textile fabric.

In embodiments of the present disclosure, the dimensions of the electrical connector may be such that it fits in a square of which the width is twice, preferably once the distance between adjacent crossover points.

In embodiments of the present disclosure, the textile fabric may further contain a third electrically conductive thread, generally parallel to the first electrically conductive thread, and a fourth electrically conductive thread, generally parallel to the second electrically conductive thread, the third electrically conductive thread and the fourth electrically conductive thread crossing at a second crossover point. In such embodiments the electrical connector may in addition establish an electrical connection between the third electrically conductive thread and the fourth electrically conductive thread. In such embodiments the electrical connector contains a third contact pad in electrical contact with the third electrically conductive thread, a fourth contact pad in electrical contact with the fourth electrically conductive thread, and a second stretchable interconnection connecting the third contact pad with the fourth contact pad. The second stretchable interconnection may be electrically insulated from the first stretchable interconnection, so that the adjacent wires can be on a different potential.

In embodiments of the present disclosure, at least one of the third contact pad and the fourth contact pad are provided at a location different from the location of the second crossover point.

In alternative embodiments, the first and second stretchable interconnections may be combined to a single stretchable interconnection which interconnects the first to fourth contact pads. In such embodiments, the first and third electrically conductive threads and the second and fourth electrically conductive threads may be used in pairs (i.e. the threads are on the same potential), which can enhance the reliability of the electrical connection.

In further embodiments of the present disclosure, a dual or multiple interconnection of the first and second conductive threads may also be provided by providing dual or multiple stretchable interconnections at or near the crossover points where an electrical connection is desired.

The contact pads and the stretchable interconnections of the electrical connector preferably contain a patterned metal layer or a patterned metal stack, such as for example a metal layer or a stack containing Cu. The patterned metal layer is preferably supported by a patterned flexible layer, such as for example a patterned polyimide layer. The pattern of the flexible layer can be different from, e.g. wider than, the pattern of the metal layer.

At the location of the electrical connector, an encapsulation layer, preferably a stretchable encapsulation layer, can be provided on the outer surfaces of the textile fabric. It is an advantage of providing an encapsulating layer that it may protect the electrical connector against external influences such as, for example, influences from humidity, water or chemicals.

In a textile fabric of the present disclosure, the first contact pad, the second contact pad, the third contact pad and/or the fourth contact pad can be connected to the corresponding electrically conductive thread by means of an electrically conductive adhesive, a solder joint, a crimp connection, or any other suitable means known by a person skilled in the art.

The first stretchable interconnection and/or the second stretchable interconnection may for example have a curved shape, a shape containing a combination of curved elements, a meander shape or any other stretchable shape known to the person skilled in the art.

In embodiments of the present disclosure the textile fabric may be a woven fabric or a non-woven fabric. In embodiments of the present disclosure wherein the textile fabric is a woven fabric, the first electrically conductive thread, the second electrically conductive thread, the third electrically conductive thread and/or the fourth electrically conductive thread may be woven in the textile fabric. In other embodiments of the present disclosure, the first electrically conductive thread, the second electrically conductive thread, the third electrically conductive thread and/or the fourth electrically conductive thread may be conductive lines provided on a surface of the textile layer. Such conductive lines may for example be formed by printing an electrically conductive ink on a woven fabric or on a non-woven fabric. Alternatively, such conductive lines may for example be formed by stitching electrically conductive threads on the textile layer.

The present disclosure further provides a method for electrically connecting a first electrically conductive thread and a second electrically conductive thread of a textile fabric, the first electrically conductive thread and the second electrically conductive thread crossing at a first crossover point, wherein the method comprises: providing an electrical connector containing a first contact pad, a second contact pad and a first stretchable electrical interconnection connecting the first contact pad with the second contact pad; and electrically connecting the first contact pad with the first electrically conductive thread at a first predetermined location and electrically connecting the second contact pad with the second electrically conductive thread at a second predetermined location different from the first predetermined location.

The first predetermined location and/or the second predetermined location may be different from the location of the first crossover point.

The method may further comprise electrically connecting a third electrically conductive thread and a fourth electrically conductive thread of the textile fabric, the third electrically conductive thread and the fourth electrically conductive thread crossing at a second crossover point different from the first crossover point, wherein the electrical connector further contains a third contact pad, a fourth contact pad and a second stretchable electrical interconnection connecting the third contact pad with the fourth contact pad, and wherein the method further comprises electrically connecting the third contact pad with the third electrically conductive thread at a third predetermined location and electrically connecting the fourth contact pad with the fourth electrically conductive thread at a fourth predetermined location different from the third predetermined location.

The third predetermined location and/or the fourth predetermined location may be different from the location of the second crossover point.

Electrically connecting a contact pad to a corresponding electrically conductive thread may for example comprise: attaching the connector to the fabric or textile layer by means of an electrically non-conductive adhesive material; and providing an electrically conductive material (e.g. an electrically conductive adhesive) at the location of the contact pads, the electrically conductive material being provided such that it forms an electrical connection between the contact pad and the corresponding electrically conductive thread. In some embodiments, the non-conductive adhesive material and other electrically insulating materials that may be present between the contact pads and the electrically conductive threads (such as for example encapsulating material of the connector, or for example an insulating coating of the electrically conductive threads) may be removed at the location of the contact pads after attaching the connector to the textile layer and before providing the electrically conductive adhesive material.

Other suitable methods may be used for electrically connecting a contact pad to a corresponding electrically conductive thread, such as for example soldering or crimping.

It is an advantage of devices and methods of the present disclosure that the contact pads can be made much smaller as compared to prior art solutions. This allows maintaining good textile properties, such as flexibility and stretchability, also at the location of the electrical connections.

It is a further advantage of devices and methods of the present disclosure that the first stretchable interconnection and the second stretchable interconnection allow a good absorption of mechanical stresses, such that mechanical stress at the connection between the contact pads and the corresponding electrically conductive threads is substantially reduced as compared to prior art solutions. As a consequence, cross connections with a good mechanical reliability and a good mechanical robustness are obtained.

It is a further advantage of devices and methods of the present disclosure that a larger variety of electrically conductive threads may be used in the textile fabric as compared to prior art approaches. For example, in embodiments of the present disclosure the first electrically conductive thread and the second electrically conductive thread may be made of a different material. Similarly, the third electrically conductive thread and the fourth electrically conductive thread may be made of a different material. For example, the first electrically conductive thread may contain a first conductive material, such as e.g. Cu, and the second electrically conductive thread may contain a second conductive material, such as e.g. stainless steel. It is an advantage of embodiments of the present disclosure that an electrical connection between the contact pads and the crossing electrically conductive threads is formed at a location different from the location of their crossover point. Therefore, the first contact pad and the second contact pad may be independently optimized to form a good electrical connection to the corresponding electrically conductive thread. If an electrical connection between crossing conductive threads is provided at the crossover point, as is the case in prior art approaches, such independent optimization is not possible.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

Figure 1:
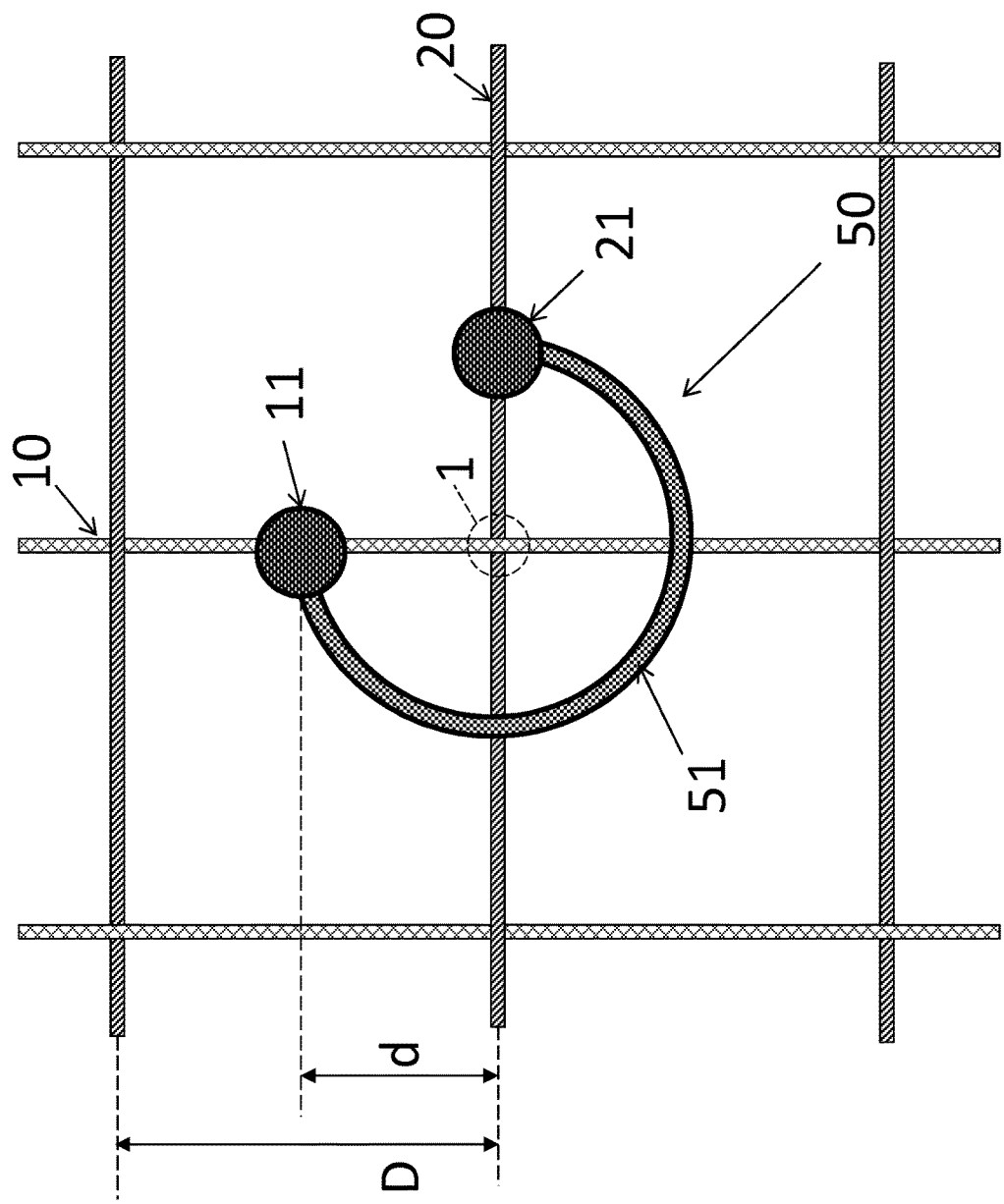
FIG. 1 illustrates a first example of a textile fabric containing an electrical connector in accordance with an embodiment of the present disclosure.

Any reference signs in the claims shall not be construed as limiting the scope of the present disclosure.

In the different drawings, the same reference signs refer to the same or analogous elements.

DETAILED DESCRIPTION OF CERTAIN ILLUSTRATIVE EMBODIMENTS

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

Furthermore, the terms first, second, third and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising" should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

In the context of the present disclosure, flexible means non-stiff, non-rigid, i.e. bendable but not stretchable. A flexible structure is adapted to be deformable in a certain direction during normal use of the structure, but does not elongate. The length does not change during bending.

In the context of the present disclosure, stretchable means resilient, i.e. elastically deformable with elongation. A stretchable structure is adapted to be elastically deformed during normal use (with elongation). For example, a stretchable thread or fabric is able to elongate in the direction of a biasing force (an applied elongating stress) and to return substantially to its original length and shape, substantially without permanent deformation, when the applied elongation stress is relaxed.

The present disclosure relates to a textile fabric containing a first electrically conductive thread and a second electrically conductive thread, the first electrically conductive thread and the second electrically conductive thread crossing at a first crossover point, the fabric further containing an electrical connector establishing an electrical connection between the first electrically conductive thread and the second electrically conductive thread.

For example, the first electrically conductive thread can be an electrically conductive yarn woven in the weft direction of a woven textile, and the second electrically thread can be an electrically conductive yarn woven in the warp direction, or vice versa.

Alternatively, the first electrically conductive thread can be an electrically conductive line printed on a surface of the textile fabric and the second electrically conductive thread can be a second electrically conductive line printed on a surface of the textile surface. The textile fabric may be a woven or a non-woven textile fabric.

In still another alternative, the first electrically conductive thread and the second electrically conductive thread can be electrically conductive threads stitched to the textile layer.

The electrical connector contains a first contact pad in electrical contact with the first electrically conductive thread, a second contact pad in electrical contact with the second electrically conductive thread, and a first stretchable electrical interconnection between the first contact pad and the second contact pad.

The first contact pad and/or the second contact pad is/are provided at a location different from the location of the first crossover point.

In embodiments of the present disclosure the fabric can further contain a third electrically conductive thread and a fourth electrically conductive thread, the third electrically conductive thread and the fourth electrically conductive thread crossing at a second crossover point, wherein the electrical connector in addition establishes an electrical connection between the third electrically conductive thread and the fourth electrically conductive thread. In such embodiments the electrical connector contains a third contact pad in electrical contact with the third electrically conductive thread, a fourth contact pad in electrical contact with the fourth electrically conductive thread, and a second stretchable interconnection between the third contact pad and the fourth contact pad. The second stretchable interconnection may be electrically insulated from the first stretchable interconnection, for example if it is desired to maintain a potential difference between on the one hand the first and third threads and on the other hand the second and fourth threads.

The third contact pad and/or the fourth contact pad is/are provided at a location different from the location of the second crossover point.

The first contact pad, the second contact pad, the third contact pad and/or the fourth contact pad can for example have a circular shape, e.g. typically with a diameter in the order of 1 mm. However, the present disclosure is not limited thereto, and other suitable contact pad sizes and contact pad shapes can be used.

The electrical connector is preferably made of a metal, such as Cu, and can be supported with a flexible layer such as a polyimide layer. It is an advantage of supporting the metal layer with a flexible layer that it results in a longer lifetime of the interconnection.

An electrical connection between a contact pad and a conductive thread can for example be established by locally providing a conductive adhesive. However, the present disclosure is not limited thereto.

In embodiments of the present disclosure, the first stretchable electrical interconnection and the second stretchable interconnection are preferably stretchable by their shape. They preferably have a curved shaped such as a circular shape or a meander shape, or a shape containing a combination of curved elements. However, the present disclosure is not limited thereto and other suitable shapes can be used, such as for example a V-shape (or a combination of V-shapes) or a straight line or a combination of straight lines, or another shape by which stretchability is achieved. Various types of stretchable interconnects are suitable and can be implemented in devices and methods of the present disclosure.

An example of a textile fabric containing an electrical connector 50 in accordance with an embodiment of the present disclosure is schematically shown in FIG. 1. FIG. 1 shows a first electrically conductive thread 10 and a second electrically conductive thread 20, the first electrically conductive thread 10 and the second electrically conductive thread 20 crossing at a first crossover point 1. In the example shown, the first thread 10 and the second thread 20 are oriented substantially orthogonal to each other. However, the present disclosure is not limited thereto and other relative orientations are possible. The electrical connector 50 contains a first contact pad 11 in electrical contact with the first electrically conductive thread 10, a second contact pad 21 in electrical contact with the second conductive thread 20, and a first stretchable electrical interconnection 51 connecting the first contact pad 11 with the second contact pad 21.

In the example shown, the first stretchable electrical interconnection 51 has a curved shape. However, the present disclosure is not limited thereto and other suitable shapes can be used.

In the example shown, the first stretchable interconnection 51 has the same width over its entire length. However, the present disclosure is not limited thereto and the width of the first stretchable interconnection 51 may vary along its length. For example, the width of the first stretchable interconnection 51 may be adapted near the first contact pad 11 and/or near the second contact pad 21 to obtain a more gradual transition between the stretchable interconnection and the contact pads.

In the example shown, the first and second contact pads 11, 21 are offset from the first crossover point by a distance d. This offset distance d may be smaller than the distance D between adjacent crossover points (the center of such crossover points) in the textile fabric.

Furthermore, in the example shown, the dimensions of the electrical connector 50 may be such that it fits in a square of which the width is twice the distance D between adjacent crossover points. In particular, the dimensions of the electrical connector 50 are in this case such that it fits in a square of which the width is about once the distance D.

It is an advantage to keep the size of the stretchable electrical connector 50 limited to avoid that the connector 50 would impair the visual appearance of the textile fabric.

Preferably, at least one of the first electrically conductive thread 10 and the second electrically conductive thread 20 has an outer coating that is electrically insulating. For example, both the first electrically conductive thread 10 and the second electrically conductive thread 20 can have an outer coating that is electrically insulating.

The first stretchable interconnection 51 can contain a metal layer, or a stack of a metal layer and a flexible supporting layer, such as for example a stack of a copper layer and a polyimide layer. In preferred embodiments the first stretchable interconnection 51 and the contact pads 11, 21 are embedded in an elastic material, such as for example an elastic polymer. It is an advantage of embedding the first stretchable interconnection and the contact pads that it further improves the mechanical stability and that it provides protection against e.g. moisture and chemicals.

Figure 2:
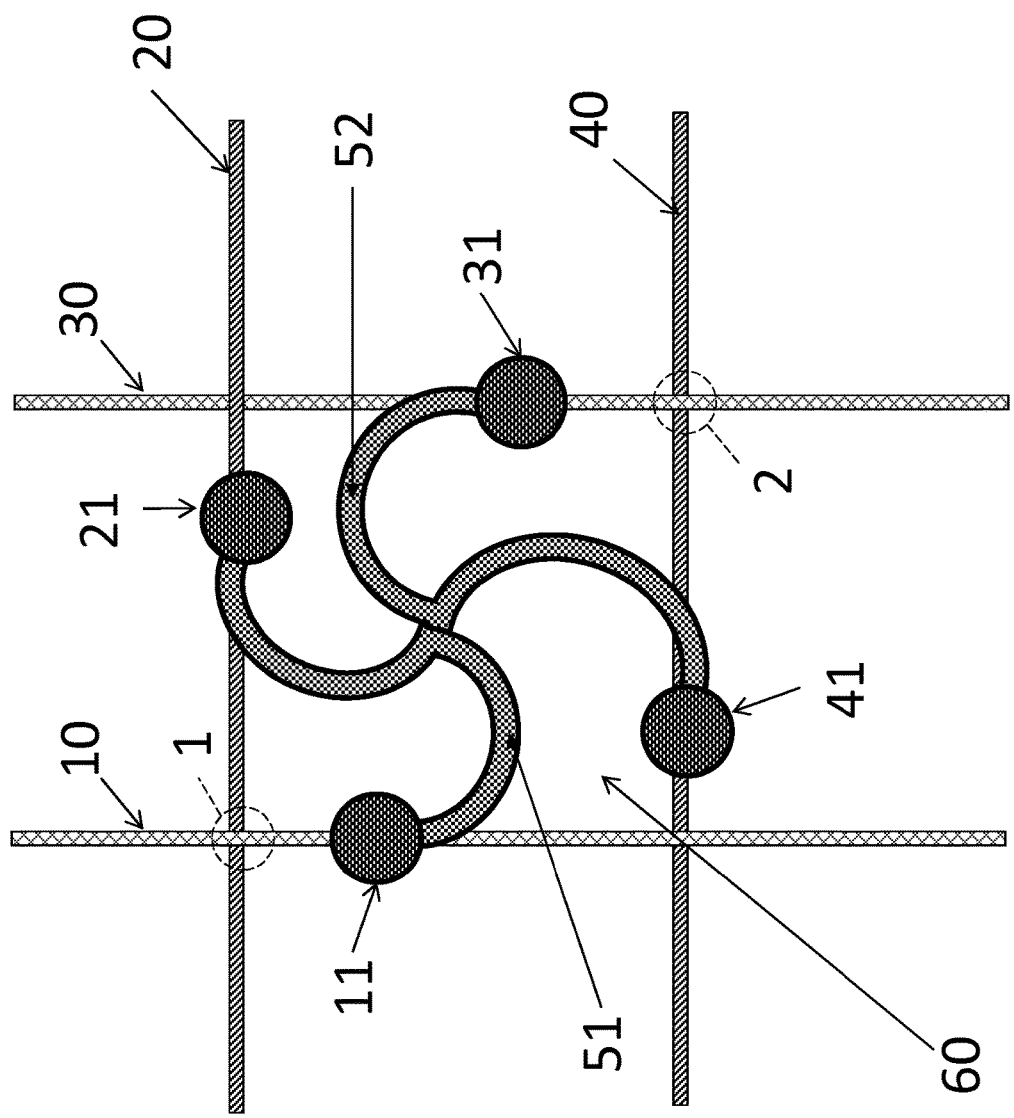
FIG. 2 illustrates a second example of a textile fabric containing an electrical connector in accordance with an embodiment of the present disclosure.

Another example of a textile fabric containing an electrical connector in accordance with the present disclosure is schematically illustrated in FIG. 2. FIG. 2 shows a first electrically conductive thread 10, a second electrically conductive thread 20, a third electrically conductive thread 30 and a fourth electrically conductive thread 40. The first electrically conductive thread 10 and the second electrically conductive thread 20 are crossing at a first crossover point 1. The third electrically conductive thread 30 and the fourth electrically conductive thread 40 are crossing at a second crossover point 2. In the example shown, the first thread 10 and the second thread 20 are oriented substantially orthogonal to each other, the third electrically conductive thread 30 is oriented substantially parallel to the first electrically conductive thread 10 and the fourth electrically conductive thread 40 is oriented substantially parallel to the second electrically conductive thread 20. However, the present disclosure is not limited thereto and other relative orientations and positions are possible.

The electrical connector 60 contains a first contact pad 11 in electrical contact with the first electrically conductive thread 10, a second contact pad 21 in electrical contact with the second conductive thread 20, a third contact pad 31 in electrical contact with the third electrically conductive thread 30 and a fourth contact pad 41 in electrical contact with the fourth electrically conductive thread 40. The electrical connector 60 further contains a first stretchable electrical interconnection 51 connecting the first contact pad 11 with the second contact pad 21 and a second stretchable electrical interconnection 52 connecting the third contact pad 31 with the fourth contact pad 41. The first stretchable electrical interconnection 51 is electrically insulated from the second stretchable electrical interconnection 52.

In the example shown, the first stretchable interconnection 51 and the second stretchable interconnection 52 have the same width over their entire length. However, the present disclosure is not limited thereto and the width of the first stretchable interconnection 51 and/or the width of the second stretchable interconnection 52 may vary along its length. For example, the width of the first stretchable interconnection 51 may be adapted near the first contact pad 11 and/or near the second contact pad 21 to obtain a more gradual transition between the stretchable interconnection and the contact pads. For example, the width of the second stretchable interconnection 52 may be adapted near the third contact pad 31 and/or near the fourth contact pad 41 to obtain a more gradual transition between the stretchable interconnection and the contact pads.

In the example shown, the first to fourth contact pads 11, 21, 31, 41 are offset from the first and second crossover points 1, 2. The offset distances are smaller than the distance D between adjacent crossover points (the center of such crossover points) in the textile fabric.

Furthermore, in the example shown, the dimensions of the electrical connector 60 may be such that it fits in a square of which the width is twice the distance D between adjacent crossover points. In particular, the dimensions of the electrical connector 60 are in this case such that it fits in a square of which the width is about once the distance D.

It is an advantage to keep the size of the stretchable electrical connector 60 limited to avoid that the connector 60 would impair the visual appearance of the textile fabric.

Preferably, at least one of the third electrically conductive thread 30 and the fourth electrically conductive thread 40 has an outer coating that is electrically insulating. Still more preferred, both the third electrically conductive thread 30 and the fourth electrically conductive thread 40 have an outer coating that is electrically insulating.

The first stretchable interconnection 51 and the second stretchable interconnection 52 can contain a metal layer, or a stack of a metal layer and a flexible supporting layer, such as for example a stack of a copper layer and a polyimide layer. In preferred embodiments the first stretchable interconnection 51 and the second stretchable interconnection 52 are embedded in an elastic material, such as for example an elastic polymer.

It is an advantage of the embodiment shown in FIG. 2 that it allows to electrically connect two pairs of crossing conductive threads using a single electrical connector. In the example shown, the electrical connections 51, 52 are insulated from each other, but alternatively they could be electrically connected to form a single electrical connection for the four contact pads.

Figure 3:
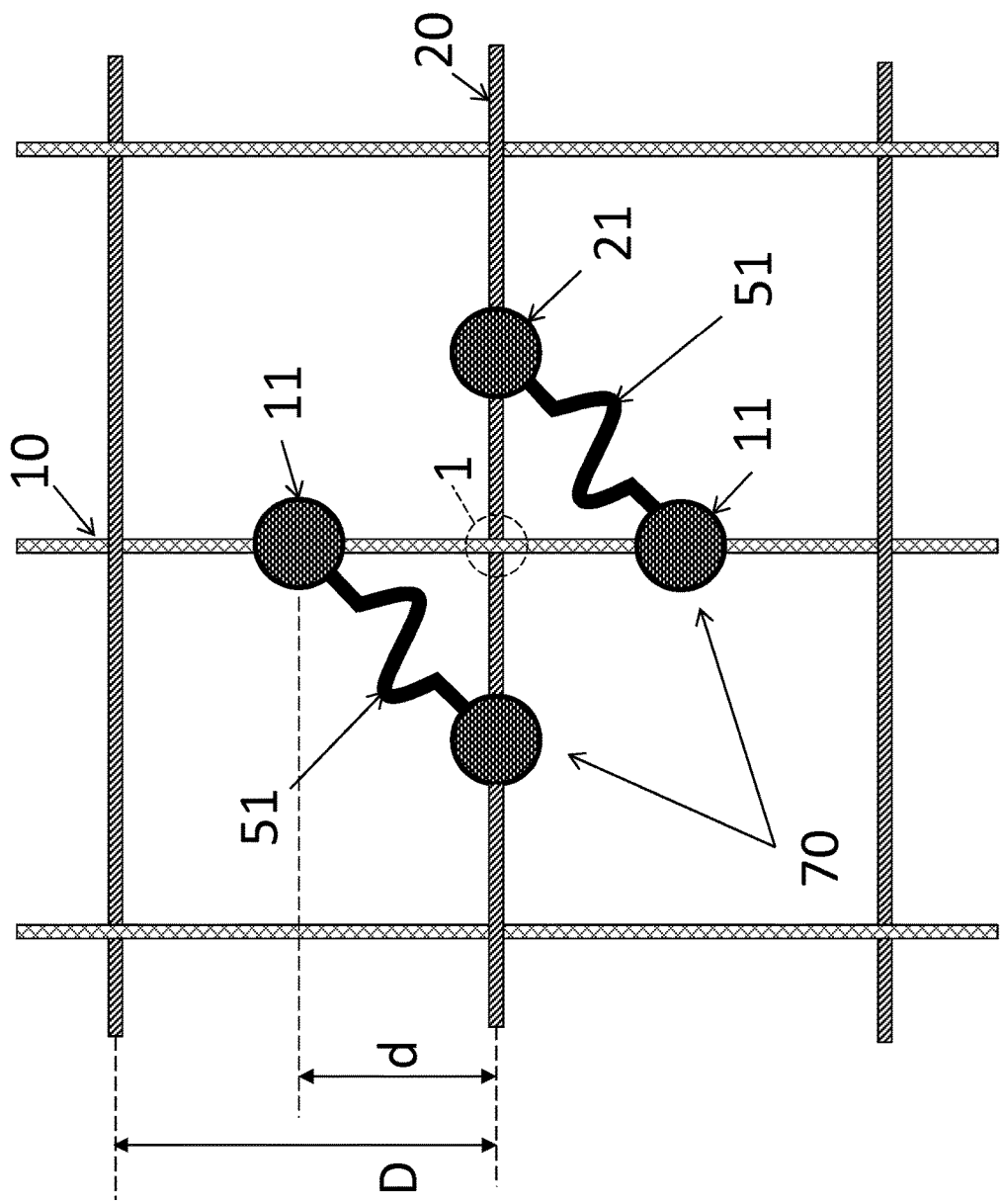
FIG. 3 illustrates a third example of a textile fabric containing an electrical connector in accordance with an embodiment of the present disclosure.

A third example of a textile fabric containing an electrical connector 50 in accordance with an embodiment of the present disclosure is schematically shown in FIG. 3. FIG. 3 provides an alternative embodiment to that of FIG. 1, with a dual interconnection at or near the first crossover point 1. In particular, two electrical connectors 70 are provided, each containing a first contact pad 11 in electrical contact with the first electrically conductive thread 10, a second contact pad 21 in electrical contact with the second conductive thread 20, and a stretchable electrical interconnection 51 connecting the respective first contact pad 11 with the respective second contact pad 21. The dual interconnection can enhance the reliability of the electrical connection in the textile fabric.

In the example shown, the stretchable electrical interconnections 51 have a meander shape. However, the present disclosure is not limited thereto and other suitable shapes can be used.

In the example shown, the stretchable interconnections 51 have the same width over their entire length. However, the present disclosure is not limited thereto and the width of the stretchable interconnections 51 may vary along its length. For example, the width of the stretchable interconnections 51 may be adapted near the first contact pad 11 and/or near the second contact pad 21 to obtain a more gradual transition between the stretchable interconnection and the contact pads.

In the example shown, the first and second contact pads 11, 21 are offset from the first crossover point by a distance d. This offset distance d may be smaller than the distance D between adjacent crossover points (the center of such crossover points) in the textile fabric.

Furthermore, in the example shown, the dimensions of the electrical connectors 70 are such that they occupy an area smaller that a square of which the width is the distance D between adjacent crossover points.

It is an advantage to keep the size of the stretchable electrical connectors 70 limited to avoid that the connector 50 would impair the visual appearance of the textile fabric.

In FIGS. 1-3 contact pads 11, 21, 31 and 41 are shown having the shape of a full circle. However, the present disclosure in not limited thereto and any other suitable shape may be used. For example, in advantageous embodiments the contact pads may have a ring shape with a central opening.

It is remarked that in FIGS. 1-3 only the conductive threads of the textile fabric are shown. There may be other, non-conductive threads in the fabric in between the shown conductive threads.

Several methods may be used for electrically connecting crossing electrically conductive threads in a textile fabric and for forming a textile fabric according to the present disclosure.

For example, the electrical connector containing first contact pad 11, second contact pad 21, and optionally third contact pad 31 and fourth contact pad 41 and containing first stretchable electrical interconnection 51 and optionally second stretchable electrical interconnection 52 can first be fabricated separately, and next it can be electrically connected to the fabric containing the electrically conductive threads.

Methods known in the art can be used for fabricating the electrical connector.

Electrically connecting an electrical connector of the present disclosure to a fabric may for example comprise: attaching the connector to the fabric or textile layer by means of an electrically non-conductive adhesive material, and connecting the contact pads to the electrically conductive threads by providing an electrically conductive material (e.g. an electrically conductive adhesive), the electrically conductive material being provided such that it forms an electrical connection between the contact pads and the corresponding electrically conductive thread. In some embodiments, the non-conductive adhesive material and other electrically insulating materials that may be present between the contact pads and the electrically conductive threads (such as for example encapsulating material of the connector, or for example an insulating coating of the electrically conductive threads) may be removed at the location of the contact pads after attaching the connector to the textile layer and before providing the electrically conductive adhesive material. Removal of electrically insulating materials can for example be done by means of laser ablation.

It is an advantage that the predetermined locations are different from the location of the crossover points in embodiments of the present disclosure. This allows for a better and more efficient removal of the insulating coating of the conductive threads by means of laser ablation, as compared to a prior art situation where the insulating coating would need to be removed at a crossover point. In embodiments of the present disclosure, this may result in a better electrical contact (lower contact resistance) between the contact pads and the electrically conductive threads.

Alternatively, electrically connecting an electrical connector of the present disclosure to a fabric may be established by means of a Non Conductive Adhesive bonding technique. This method may contain the following steps: attaching the connector to the fabric or textile layer by means of an electrically non-conductive adhesive material, applying a pressure to displace the adhesive out of the areas corresponding to the contact pads, and curing the adhesive. In this approach, the insulating coating of the electrically conductive threads is locally removed at the locations where an electrical contact is to be established, before attaching the connector to the fabric.

Still other methods can be used for electrically connecting an electrical connector of the present disclosure to a textile fabric, such as for example by means of crimp connections.

The foregoing description details certain embodiments of the disclosure. It will be appreciated, however, that no matter how detailed the foregoing appears in text, the disclosure may be practiced in many ways. It should be noted that the use of particular terminology when describing certain features or aspects of the disclosure should not be taken to imply that the terminology is being re-defined herein to be restricted to including any specific characteristics of the features or aspects of the disclosure with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the invention.

What is claimed is:

1. A textile fabric comprising a plurality of electrically conductive yarn threads woven in a weft direction and comprising a first electrically conductive thread, the fabric further comprising a plurality of electrically conductive yarn threads woven in a warp direction and comprising a second electrically conductive thread, the first electrically conductive thread and the second electrically conductive thread crossing at a first crossover point, the fabric further comprising an electrical connector establishing an electrical connection between the first electrically conductive thread and the second electrically conductive thread, wherein the electrical connector comprises a first contact pad in direct electrical contact with the first electrically conductive thread and not the second electrically conductive thread, a second contact pad in direct electrical contact with the second electrically conductive thread and not the first electrically conductive thread, and a first stretchable electrical interconnection connecting the first contact pad with the second contact pad.

2. The textile fabric according to claim 1, wherein at least one of the first contact pad and the second contact pad are provided at a location different from the location of the first crossover point.

3. The textile fabric according to claim 1, wherein adjacent crossover points in the textile fabric are separated by a distance (D), and wherein at least one of the first and second contact pads is offset from the first crossover point by a distance (d) which is at most twice the distance (D) between adjacent crossover points in the textile fabric.

4. The textile fabric according to claim 3, wherein the distance (d) is at most one times the distance (D) between adjacent crossover points in the textile fabric.

5. The textile fabric according to claim 1, wherein adjacent crossover points in the textile fabric are separated by a distance (D), and wherein the dimensions of the electrical connector are such that it fits in a square of which the width is twice the distance (D) between adjacent crossover points.

6. The textile fabric according to claim 5, wherein the dimensions of the electrical connector are determined so as to fit in a square of which the width is one times the distance (D) between adjacent crossover points.

7. The textile fabric according to claim 5, wherein at least one of the third contact pad and the fourth contact pad are provided at a location different from the location of the second crossover point.

8. The textile fabric according to claim 1, further comprising a third electrically conductive thread and a fourth electrically conductive thread, the third electrically conductive thread and the fourth electrically conductive thread crossing at a second crossover point, wherein the electrical connector in addition establishes an electrical connection between the third electrically conductive thread and the fourth electrically conductive thread, wherein the electrical connector comprises a third contact pad in electrical contact with the third electrically conductive thread, a fourth contact pad in electrical contact with the fourth electrically conductive thread, and a second stretchable interconnection connecting the third contact pad with the fourth contact pad, the second stretchable interconnection being electrically insulated from the first stretchable interconnection.

9. The textile fabric according to claim 1, further comprising a third electrically conductive thread and a fourth electrically conductive thread, the third electrically conductive thread and the fourth electrically conductive thread crossing at a second crossover point, wherein the electrical connector comprises a third contact pad in electrical contact with the third electrically conductive thread, a fourth contact pad in electrical contact with the fourth electrically conductive thread, and wherein the electrical connector establishes a stretchable electrical connection between the first to fourth contact pads.

10. The textile fabric according to claim 1, wherein a plurality of electrical connectors is provided at or near the first crossover point to provide a plurality of stretchable interconnections between the first and second electrically conductive threads.

11. The textile fabric according to claim 1, wherein each electrical connector comprises a patterned metal layer supported by a patterned flexible layer.

12. The textile fabric according to claim 1, wherein at least one of the contact pads is electrically connected to the corresponding conductive thread by an electrically conductive adhesive.

13. The textile fabric according to claim 1, wherein the first stretchable electrical interconnection has one of the following shapes: a curved shape, a shape comprising a combination of curved elements, and a meander shape.

14. A method for electrically interconnecting a first electrically conductive thread of a plurality of electrically conductive yarn threads woven in a weft direction with a second electrically conductive thread of a plurality of electrically conductive yarn threads woven in a warp direction of a textile fabric, the first electrically conductive thread and the second electrically conductive thread crossing at a first crossover point, wherein the method comprises:
 providing an electrical connector comprising a first contact pad, a second contact pad, and a first stretchable electrical interconnection connecting the first contact pad with the second contact pad; and
 directly electrically connecting the first contact pad with the first electrically conductive thread and not the second electrically conductive thread at a first predetermined location and directly electrically connecting the second contact pad with the second electrically conductive thread and not the first electrically conductive thread at a second predetermined location.

15. The method according to claim 14, wherein at least one of the first predetermined location and the second predetermined location are different from the location of the first crossover point.

16. The method according to claim 14, wherein electrically connecting the first contact pad with the first electrically conductive thread and electrically connecting the second contact pad with the second electrically conductive thread comprises:
 attaching the electrical connector to the textile fabric by an electrically non-conductive adhesive material;
 locally removing the non-conductive adhesive material and any other electrically insulating material that is present between the first contact pad and the first electrically conductive thread at the first predetermined location and between the second contact pad and the second electrically conductive thread at the second predetermined location; and
 locally providing an electrically conductive material at the first predetermined location and at the second predetermined location.

* * * * *